United States Patent [19]
Sandberg et al.

[11] Patent Number: 5,631,610
[45] Date of Patent: May 20, 1997

[54] SINGLE SIDE-BAND MODULATION SYSTEM FOR USE IN DIGITALLY IMPLEMENTED MULTICARRIER TRANSMISSION SYSTEMS

[75] Inventors: Stuart Sandberg, Arlington; Michael Tzannes, Newton, both of Mass.

[73] Assignee: Aware, Inc., Bedford, Mass.

[21] Appl. No.: 591,831

[22] Filed: Jan. 25, 1996

[51] Int. Cl.$^6$ .............................. H03C 1/60; H03D 1/00
[52] U.S. Cl. .................. 332/170; 329/357; 375/270; 375/301; 375/321
[58] Field of Search ............... 332/170; 329/357; 375/270, 301, 321

[56] References Cited

U.S. PATENT DOCUMENTS

| | | | |
|---|---|---|---|
| 3,573,380 | 4/1971 | Darlington | 332/170 |
| 4,131,766 | 12/1978 | Narasimha | 370/70 |

*Primary Examiner*—Siegfried H. Grimm
*Attorney, Agent, or Firm*—Calvin B. Ward

[57] ABSTRACT

A communication system having a modulation system for transmitting a symbol set via a single side-band modulated carrier and a demodulation system for recovering the in-phase and quadrature signals from the modulated carrier. The modulation circuit receives M symbol values and generates M time domain samples for each of the in-phase and quadrature signals. The in-phase and quadrature signals can then be combined to generate the single side-band modulated carrier. The modulation circuit includes a transform circuit for generating M transformed symbol values by computing the transform of the M symbol values. A polyphase filter bank having 2M FIR filters is used to process the output of the transform circuit. Each filter has g taps, where g is an integer greater than 1. The outputs of the polyphase filters are combined with the outputs of the polyphase filters generated from a previously received set of M symbols to generate the M time-domain signal values of the in-phase signal. The quadrature signal is generated by a similar circuit having two additional elements. The demodulation circuit recovers symbol sets from the in-phase or quadrature signals generated from M received time-domain signal values. The demodulator includes a memory for storing the 2M most recently received time-domain values, a polyphase filter bank, a polyphase processing circuit, and a transform circuit. The demodulation circuit for recovering a symbol set from the quadrature signal is similar to that for recovering the symbol set from the in-phase signal, except that the polyphase processor combines the outputs of the polyphase filters according to a different set of relationships and the sign of every other output from the transform is changed.

4 Claims, 3 Drawing Sheets

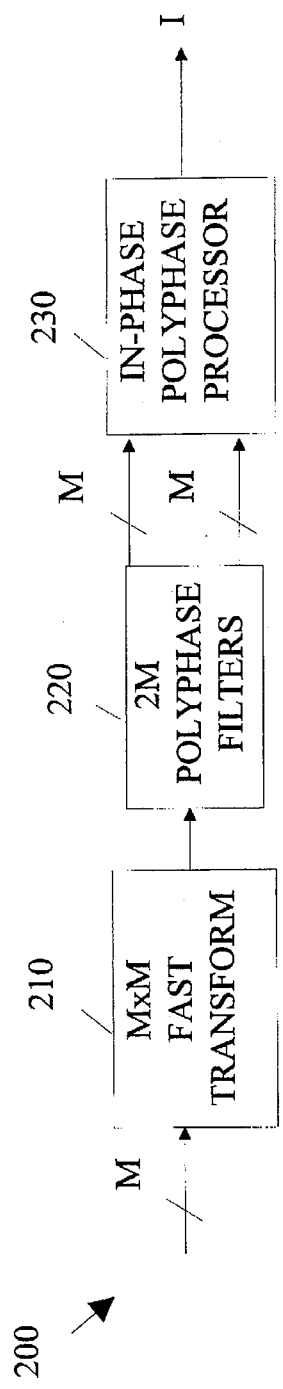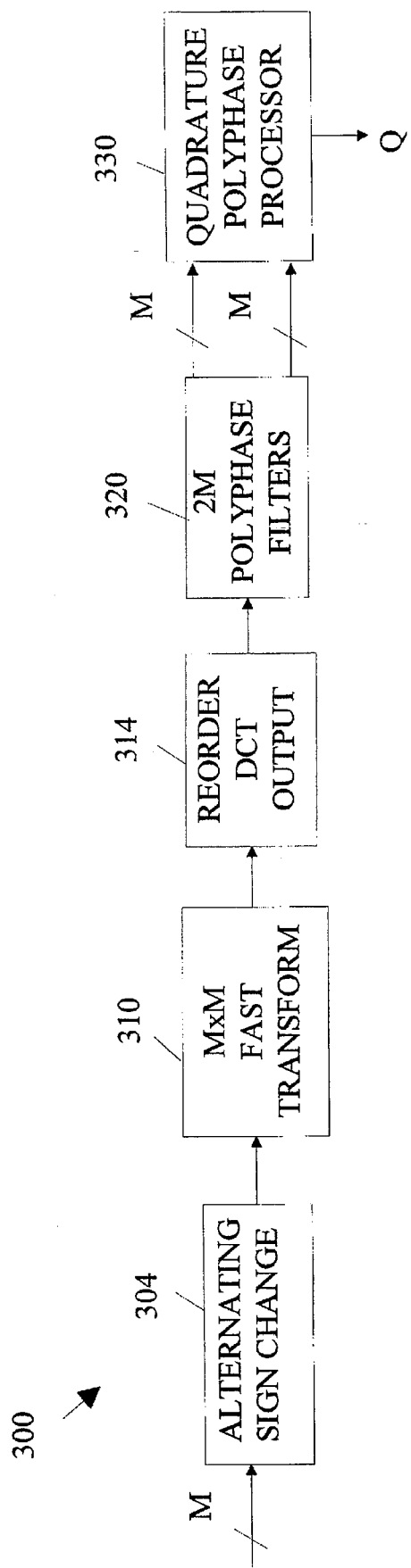

SINGLE SIDE-BAND MODULATION SYSTEM FOR USE IN DIGITALLY IMPLEMENTED MULTICARRIER TRANSMISSION SYSTEMS

FIELD OF THE INVENTION

The present invention relates to systems for multicarrier transmission of data, and more particularly, to an improved method for coding and decoding data for use in single side-band modulation systems.

BACKGROUND OF THE INVENTION

In a multicarrier system, a communication path having a fixed bandwidth is divided into a number of sub-bands having different frequencies. The width of the sub-bands is chosen to be small enough to allow the distortion in each sub-band to be modeled by a single attenuation and phase shift for the band. If the noise level in each band is known, the volume of data sent in each band may be optimized by choosing a symbol set having the maximum number of symbols consistent with the available signal-to-noise ratio of the channel. By using each sub-band at its maximum capacity, the amount of data that can be transmitted in the communication path is maximized.

In practice, such systems are implemented by banks of digital filters which make use of fast Fourier transforms or other transforms as described in detail below. Consider the case in which a single data stream is to be transmitted over the communication path which is broken into M sub-bands. During each communication cycle, the portion of the data stream to be transmitted is converted to M symbols chosen to match the capacity of the various channels. Each symbol is the amplitude of a corresponding sub-carrier. The time domain signal to be sent on the communication path is obtained by modulating each sub-carrier by its corresponding amplitude and then adding the modulated carriers to form the signal to be placed in the communication path. This operation is normally carried out by transforming the vector of M symbols via the inverse Fourier transform to generate M time domain values that are sent in sequence on the communication path. At the other end of the communication path, the M time domain values are accumulated and transformed via a Fourier transform to recover the original M symbols after equalization of the transformed data to correct for the attenuation and phase shifts that occurred in the channels.

The above discussion assumes that the time domain signal is sent on the communication path in the base band. For many applications, it is desirable to upconvert the multichannel signal at the transmitter so that it is sent in a higher frequency band. This is accomplished by modulating a high frequency carrier with the multicarrier signal. To minimize the bandwidth of the data about the high frequency carrier, it is advantageous to use single side band modulation of the carrier. A single side band upconversion of a signal s(t) to frequency f may be generated from s(t) and ŝ(t), where ŝ(t) is the Hilbert transform of s(t), according to the formula $$F(t)=s(t)*\cos(2\pi ft)+\hat{s}(t)\sin(2\pi ft) \qquad (1)$$

The pair of signals, s(t) and ŝ(t), are also known as an in-phase and quadrature pair of signals.

The computational workload imposed by the need to generate the Hilbert transform of s(t) from s(t) is a significant. This is often accomplished with an FIR filter which, depending on the design goals, requires many tens or hundreds of taps. It can also be accomplished using analog bandpass filters, but satisfactory analog designs are difficult to manufacture to the required accuracy.

Broadly, it is the object of the present invention to provide an improved multi-carrier transmission system.

It is a further object of the present invention to provide a multi-carrier transmission system that provides both the in-phase and quadrature components needed to generate a single side-band modulation of a high frequency carrier with a computational workload that is significantly less than that required to generate the components by directly computing the Hilbert transform of s(t).

These and other objects of the present invention will become apparent to those skilled in the art from the following detailed description of the invention and the accompanying drawings.

SUMMARY OF THE INVENTION

The present invention is a communication system having a modulation system for transmitting a multichannel-based symbol set via a single side-band modulated carrier and a demodulation system for generating in-phase and quadrature outputs from the modulated carrier which, after equalization, reproduce the original symbols. The modulation circuit receives M symbol values and generates M time domain in-phase and M time domain quadrature signals. The in-phase and quadrature signals can then be combined to generate the single side-band modulated carrier. The modulation circuit includes a transform circuit for generating M transformed symbol values by computing a transform using an algorithm that is of order MlogM and subchannels the frequency domain into narrow subchannels. A polyphase filter bank having 2M FIR filters is used to process the output of the transform circuit. Each filter has g taps, where g is an integer greater than 1. The inputs of the filters are connected to the transform circuit such that one of the transformed values is input to each filter, each transformed symbol value being used as input to two of the filters. The outputs of the polyphase filters are combined in pairs, incorporating single tap delays and negation circuitry to generate the M time-domain signal values of the in-phase signal. The quadrature signal is generated by a similar circuit having two additional elements, a circuit for changing the sign of every other symbol and a circuit for reordering the output of the transform circuit.

A demodulation circuit according to the present invention for recovering symbol sets from M received time-domain signal values includes a memory for storing the gM most recently received time-domain values, a polyphase filter bank, a polyphase processing circuit, and a transform circuit. Here, g is an integer greater than 1. The polyphase filter bank having 2M FIR filters, each filter having g taps. The inputs of the filters are connected to the storing means such that each received signal value is used as input to one of the filters. The outputs of the polyphase filter bank are combined by the polyphase processor to generate M values that are transformed. If the transmission channel is perfect, the outputs of the transform are the original symbols. If the channel is less than ideal, then these outputs are combined with the symbols recovered from the Hilbert transform of the signal to generate the original symbol set.

A demodulation circuit according to the present invention for generating the quadrature transform of the received signal is similar to that for generating the in-phase transform of the received signal, except that the polyphase processor combines the outputs of the polyphase filters according to a different set of relationships and the sign of every other output from the transform is changed.

BRIEF DESCRIPTION OF THE DRAWINGS

FIG. 2 is a block diagram of the preferred embodiment of an in-phase signal generator according to the present invention.

FIG. 3 is a block diagram of the preferred embodiment of a quadrature signal generator according to the present invention.

DETAILED DESCRIPTION OF THE INVENTION

Figure 1:
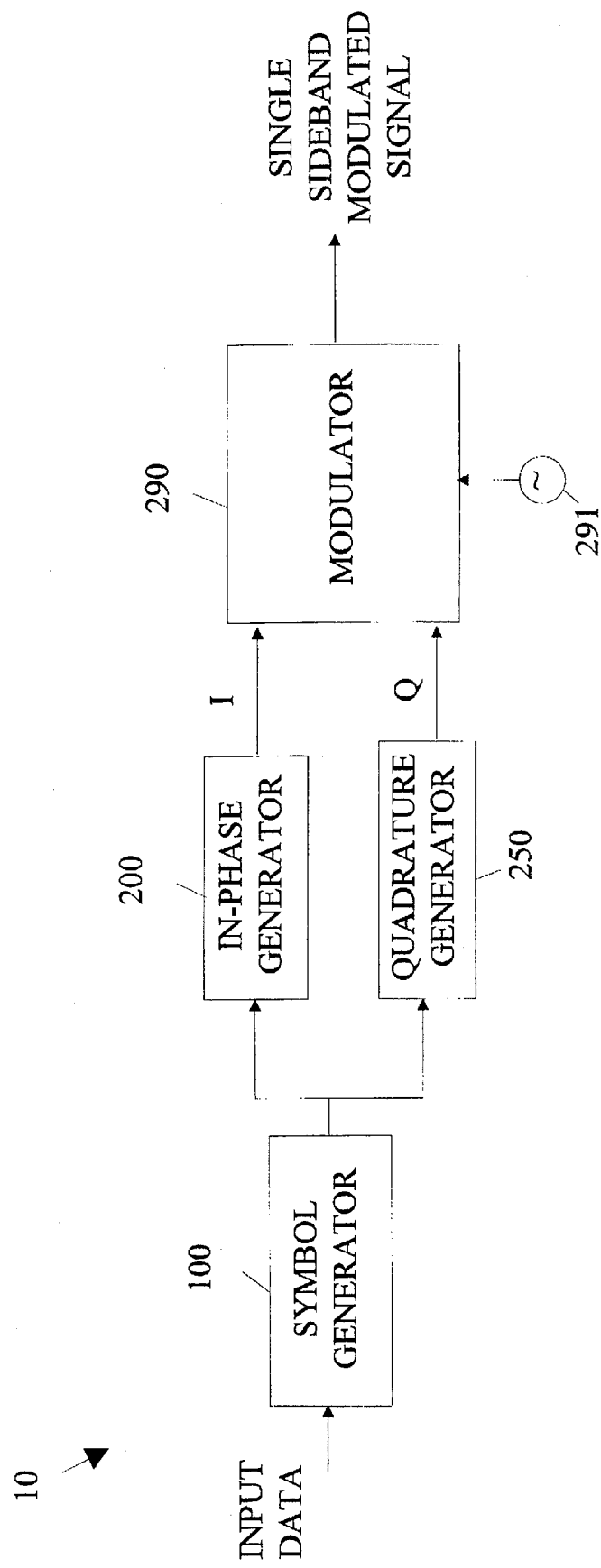
FIG. 1 is a block diagram of a modulation circuit according to the present invention.

The manner in which the present invention obtains its advantages may be more easily understood with reference to FIG. 1 which is a block diagram of a modulation circuit 100 according to the present invention. The input data is accumulated by a symbol generator 100 which "packages" the data as M symbols which will be used to modulate M sub-carriers within a transmission band at frequency f.

The number of states which each symbol can take on is determined by the signal to noise ratio in the corresponding sub-carrier channel and the acceptable error rate for the transmission of the data. In principal, different symbols will have different numbers of states if the signal-to-noise ratio in the different sub-carrier channels varies across the transmission band. For simplicity, consider a system in which the input data stream is a string of binary data and the sub-carrier channels all have the same signal-to-noise ratio. Also assume that the acceptable error rate is such that each symbol can have 16 states. Then symbol generator 100 would generate one symbol corresponding to each group of 4 bits received. The symbols could, for example, have values from −8/8 to 7/8 or 0 to 15.

When symbol generator 100 has accumulated M symbols, the M symbols are transformed to M time domain signal values that will be transmitted in the communication band. These M time domain signal values are computed from M in-phase time domain signal values and M quadrature time domain signal values as described above with reference to Eq. (1). The in-phase time domain signal values are generated by an in-phase generator 200, and the quadrature time domain signal values are generated by a quadrature signal generator 250. The in-phase and quadrature values are combined by modulator 290 to generate a single side-band modulated signal at the frequency of oscillator 291.

Before discussing the details of the implementations of the in-phase and quadrature generators, a more formal description of the equivalent transformations performed by these generators will be given. Consider the in-phase signal. Symbol generator 100 generates frames of M symbols. Denote the symbols of the $F^{th}$ such frame by $^F S_i$, for i=1 to M. The contribution of each of the symbols to final in-phase signal may be written as vector having gM elements, where g is a positive integer, referred to as the genus of the transformation. Denote the vector corresponding to the $k^{th}$ symbol by $^k V_i$, for i=1 to gM. Then the contribution, $^F T_i$, of the $F^{th}$ frame to the modulated signal is given by $$^F T_i = \sum_{i=1}^{M} {^F S_i} * {^i V_j} \qquad (2)$$

This contribution is combined with that of previous frames by adding the T vectors off-set by M samples. That is, $$S_i = \sum_F {^F T_i} + {^{F-1} T_{i+M}} + {^{F-2} T_{i+2M}} \qquad (3)$$

The summation over F is taken over those frames for which contributions are still present.

In the case of a Fourier transform based system, g=1 and the $^k V_i$ are the elements of the conventional Fourier transform. Systems with g=1, however, are more prone to noise than systems with higher genus values. The construction of transforms with higher genus is accomplished by defining a prototype finite impulse response filter having elements $P_i$ for i=1 to gM. The prototype filter is a lowpass filter. The vectors $^k V_i$ are generated from the prototype filter by modulating the filter elements via cos(ki). Construction of such filter banks is known to those skilled in the art, and hence, will not be discussed in detail here. For those wishing a more detailed explanation of the process for generating sets of filter coefficients, see J. Rothweiler, "Polyphase Quadrature Filters—a New sub-band coding technique" *IEEE Proceedings of the 1983 ICASSP Conference*, pp 1280–1283 which is hereby incorporated by reference.

While the above formal description of the operations carried out by the in-phase generator are more easily understood, actual implementation of a generator in the form would be computationally inefficient. To generate the contribution from one frame, Eq. (2) requires $gM^2$ multiplications. To avoid this computational load, the present invention employs an implementation that makes use of the fast implementation algorithms available for discrete transforms that transform the frequency domain into multiple narrow-band subchannels such as discrete Fourier, cosine, and Hartley. The various forms of discrete cosine transformations are described in Discrete Cosine Transform Algorithms, Advantages and Applications, K. R. Rao and P. Yip, Acaddmic Press, 1990.

Refer now to FIG. 2 which is a block diagram of the preferred embodiment of an in-phase generator 200 according to the present invention. The set of M symbols provided by symbol generator 100 is first converted to M time domain samples via transform generator 210. The output of generator 210 is used as input to a bank of 2M polyphase filters. Each polyphase filter is a g-tap finite impulse response filter (FIR). The polyphase filter bank will be discussed in more detail below. For the purpose of the present discussion, it is sufficient to note that for each set of M time domain samples that enters the filter bank, 2M time domain samples are generated. These 2M time domain samples are combined in an in-phase processor 230 to generate a sequence of M in-phase time domain samples.

The computational workload in generating the in-phase samples is of order (MlogM+2gM) multiplications. Hence, a considerable computational reduction is realized for large values of g or M over an implementation that does not use fast algorithms, and hence, requires of order $(gM)^2$ computations.

Before describing the polyphase filters in detail, the manner in which the quadrature time domain samples are generated will first be discussed with reference to FIG. 3 which is a block diagram of the preferred embodiment of a quadrature signal generator 300 according to the present invention. The present invention is based on the observation that the quadrature time domain samples can be obtained by a very similar circuit to that used to generate the in-phase samples provided certain reordering and modification of the symbols are employed. The frame of symbols is first modified by circuit 304 by changing the sign of every other symbol. The modified symbol frame is then transformed by a fast transform circuit 310 which is identical to transform 210 discussed above. The output of transform circuit 310 is then reordered by circuit 314 before being inputted to a polyphase filter bank 320 which is identical to polyphase filter bank 220. The output of polyphase filter bank 320 is then processed by quadrature processor 330 to generate a sequence of M quadrature time domain samples for each frame of M symbols received.

The construction of the polyphase filters used in filter banks 220 and 320 may be more easily understood with reference to the coefficients of the prototype filter discussed above. As noted above, a filter bank having M filters in which each filter is an FIR having gM taps and in which the $k^{th}$ filter is a carrier centered at the $k^{th}$ frequency, modulated with a prototype FIR filter having coefficients $P_j$, j=0 to gM−1 centered at a frequency of zero. The 2M polyphase filters used in the present invention are defined with respect to these coefficients. Denote these 2M filters by $G_k$, for k=0 to 2M−1. Each of the 2M filters has g-taps. The coefficients of the $k^{th}$ filter are given by the vector $$G_k = [P_k, 0, -P_{2M+k}, 0, P_{4m+k}, 0, -P_{6M+k}, 0, \ldots] \quad (4)$$

which has only the first g terms.

Denote the 2M input lines to the polyphase filter bank by $\rho_i$, for i=0 to 2M−1. The filter to input line connections are as follows: Inputs $\rho_i$, for i=0 to (M/2)−1, are connected to filters $G_k$, for k=(3M/2) to 2M−1, respectively. Inputs $\rho_i$, for i=(M/2) to M−1 are connected to filters $G_k$, for k=0 to (M/2)−1, respectively. Inputs $\rho_i$, for i=M to 2M−1, are connected to filters $G_k$, for k=(3M/2)−1 to (M/2), respectively. The outputs of the polyphase filter banks will be denoted by $\theta_i$, for I=0 to 2M−1. Output $\theta_i$ is connected to the output of the filter connected to $\rho_i$.

In the case of the in-phase modulator 200, the inputs to the polyphase filter bank are connected directly to the outputs of the transform circuit. The transform circuit generates M time domain samples $^kT_0 \ldots {}^kT_{M-1}$ from the $k^{th}$ frame of symbols input to the modulator, where the samples are ordered in time domain as indicated above. The transform outputs are connected to the polyphase inputs in the same order, i.e., $^kT_i$ is connected to $\rho_i$, for i=0 to M−1, and $\rho_i$ is connected to $^kT_{i-M}$ for i=M, … 2M−1.

In the case of quadrature modulator 300, the outputs of the transform circuit are re-ordered before being processed by the polyphase filter bank. The re-ordering reverses the order of the inputs, i.e., reorder circuit 314 connects the outputs of transform 310 to the inputs of polyphase filter bank 320 such that $^kT_{M-i-1}$ is connected to $\rho_i$, for i=0 to M−1, and $\rho_i$ is connected to $^kT_{2M-i-1}$ for i=M, … 2M−1.

As noted above, the outputs of the polyphase filter bank 220 are processed by an in-phase polyphase processor to generate M time domain samples representing the in-phase modulated signal. Processor 230 combines polyphase outputs from two successive frames. Denote the 2M inputs to processor 230 generated from the $k^{th}$ frame of symbols by $^ku_j$, where j=0 to 2M−1. It is assumed that processor 230 stores $^{(k-1)}u_j$ in addition to the inputs from the current frame of symbols. The M outputs generated in sequence by processor 230 when the inputs corresponding to the $k^{th}$ frame are processed will be denoted by $O_j$, for j=0 to M−1. These M values are sent in sequence as the next M time domain samples of the in-phase signal, I.

The operations performed by processor 230 may be most easily discussed in reference to the outputs generated by the above defined inputs. Each output is generated from the sum or difference of two of the input signal values either from the current frame of signals or the previous frame of signals.

When the inputs corresponding to the kth frame enter processor 230, the outputs from processor 230 are as follows:

| | |
|---|---|
| $O_0$ | $^ku_{(M/2)} - {}^{(k-1)}u_{(3M/2)-1}$ |
| $O_1$ | $^ku_{(M/2)+1} - {}^{(k-1)}u_{(3M/2)-2}$ |
| . | . |
| . | . |
| . | . |
| $O_{(M/2)-1}$ | $^ku_{(M-1)} - {}^{(k-1)}u_M$ |
| $O_{(M/2)}$ | $-{}^{(k-1)}u_0 - {}^ku_{2M-1}$ |
| $O_{(M/2)+1}$ | $-{}^{(k-1)}u_1 - {}^ku_{M-2}$ |
| . | . |
| . | . |
| . | . |
| $O_{M-1}$ | $-{}^{(k-1)}u_{(M/2)} - {}^ku_{3M/2}$ |

Processor 330 performs an analogous operation in the case of the quadrature signal. The mapping between the inputs and outputs of processor 330 is as follows:

| | |
|---|---|
| $O_0$ | $^ku_{(M/2-1)} + {}^{(k-1)}u_{(3M/2)}$ |
| $O_1$ | $^ku_{(M/2)-2} + {}^{(k-1)}u_{(3M/2)+1}$ |
| . | . |
| . | . |
| . | . |
| $O_{(M/2)-1}$ | $^ku_0 + {}^{(k-1)}u_{2M-1}$ |
| $O_{(M/2)}$ | $-{}^{(k-1)}u_{M-1} + {}^ku_M$ |
| $O_{(M/2)+1}$ | $-{}^{(k-1)}u_{M-2} + {}^ku_{M+1}$ |
| . | . |
| . | . |
| . | . |
| $O_{M-1}$ | $-{}^{(k-1)}u_{(M/2)} + {}^ku_{(3M/2)-1}$ |

Here, the symbols are defined as per processor 230.

Figure 4:
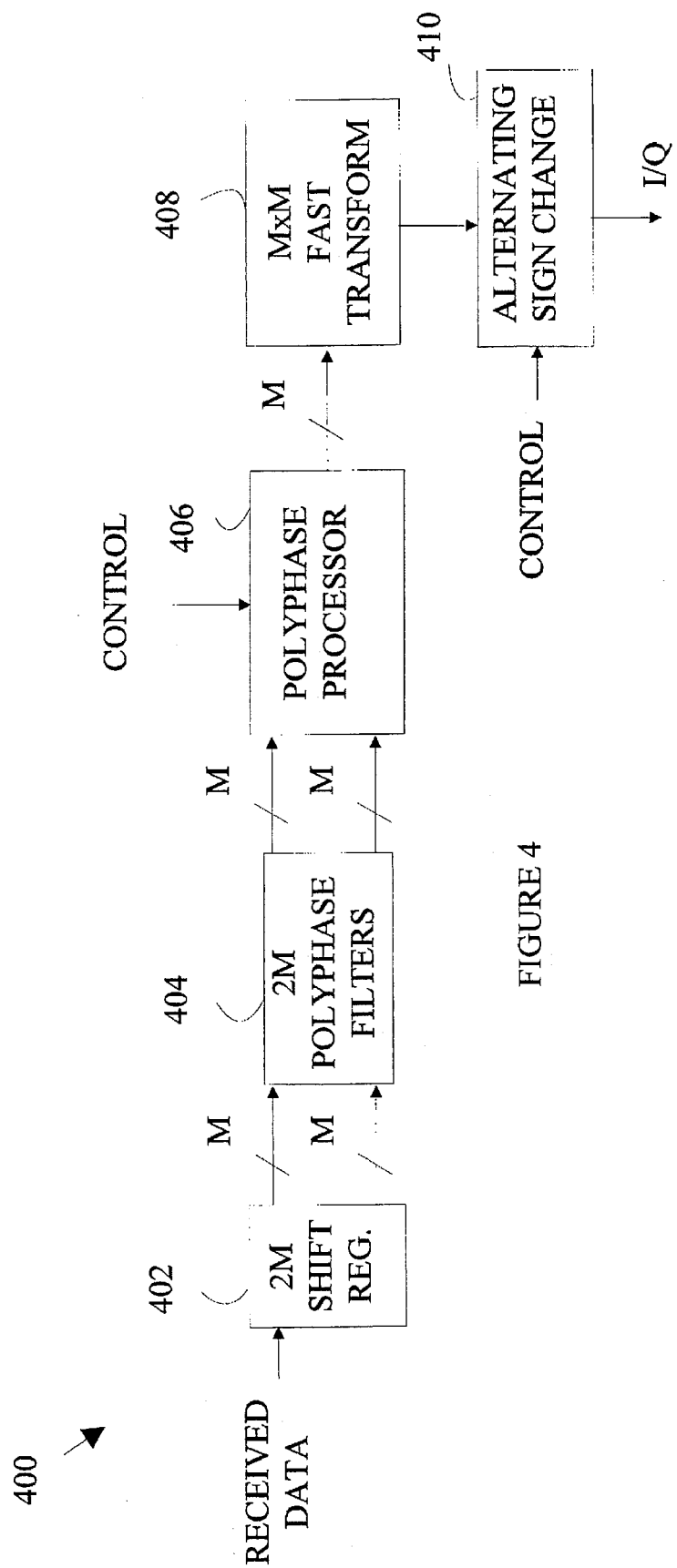
FIG. 4 is a block diagram of a demodulator according to the present invention.

The manner in which a single side-band modulated signal is demodulated will now be explained in detail with reference to FIG. 4 which is a block diagram of demodulator 400 for generating in-phase and quadrature outputs from a single side-band signal generated by an apparatus such as modulator 10 shown in FIG. 1. As will be explained in more detail, demodulator 400 generates either the in-phase or quadrature components depending on a control signal. If the transmission channel over which the single side-band modulated signal was sent is perfect, the symbol set recovered from the in-phase signal is the original symbol set used to generate the in-phase and quadrature signals. If the channel is less than ideal, the symbols obtained from the quadrature signal are combined with those from the in-phase signal to obtain the original symbol set. The two sets of symbols are combined by computing the weighted sums of the symbols from the in-phase and quadrature signal obtained from the current frame. This channel correction operation may also require that symbols obtained and previous and future frames be included in the weighted sums. The weighting coefficients are determined by sending known frames of symbols over the channel as training sets and computing the weighting factors that reproduce the training sets. In general, if channel characteristics vary only slowly in time, the training operation can be carried out as part of the setup procedure when a channel is put into service. If the channel characteristics vary rapidly, differential techniques in which a current symbol is used as a reference for a future signal can be employed. Since such training and differential computations are known to those skilled in the art, the details of such training will not be discussed further here.

Demodulator 400 receives digitized data consisting of the single side-band modulated signal after the signal has been down-converted to baseband. The successive values are shifted into a shift register of length 2M shown at 402. After each frame of M new samples are input to shift register 402, the contents of shift register 402, including the previously received M samples are output to a bank of 2M polyphase filters 404 which is identical to the bank of polyphase filters discussed above with reference to the modulation circuitry. The 2M outputs of the polyphase filters generated from the contents of shift register 402 and the previously received (g−1) values are processed by polyphase processor 406 which generates M components that are transformed by fast transform circuit 408. Transform circuitry performs the inverse of the transformation performed by transform circuits 210 and 310 discussed above.

The output of transform circuit 408 is processed by a sign change circuit 410 when the quadrature components are processed. Sign change circuit 410 changes the sign of the odd numbered components generated by transform circuit 408, assuming the components are numbered from 0 to M−1. When the in-phase components are generated, sign change circuit 410 does not alter the output of transform circuit 410. The outputs of sign change circuit 410 are M frequency amplitude values representing the in-phase and quadrature components. These values are then used by an equalizer circuit to recover the original M symbols that were input to the modulation circuit 10 discussed above.

The manner in which polyphase processor 406 operates will now be discussed in more detail. Polyphase processor 406 re-orders and combines the 2M inputs thereto in a manner which is determined by whether the quadrature or in-phase components are being generated by circuit 400. This choice is indicated by the control signal shown in FIG. 4. Denote the 2M inputs to polyphase processor 406 by $Q_0, \ldots Q_{2M-1}$, and denote the M outputs from polyphase processor 406 by $P_0, \ldots P_{M-1}$. Then the relationship between the inputs and outputs when the in-phase components are being generated is given by $P_0 \quad Q_{\frac{M}{2}-1} + Q_{\frac{M}{2}}$ $P_1 \quad Q_{\frac{M}{2}-2} + Q_{\frac{M}{2}+1}$

. .
. .
. .

$P_{\frac{M}{2}-1} \quad Q_0 + Q_{M-1}$ $P_{\frac{M}{2}} \quad Q_M - Q_{2M-1}$ $P_{\frac{M}{2}+1} \quad Q_{M+1} - Q_{2M-2}$

. .
. .
. .

$P_{M-1} \quad Q_{\frac{3M}{2}-1} - Q_{\frac{3M}{2}}$

The relationship between the inputs and outputs of polyphase processor 406 when the quadrature components are being generated is given by $P_0 \quad -Q_{\frac{3M}{2}-1} + Q_{\frac{3M}{2}}$ $P_1 \quad -Q_{\frac{M}{2}-2} - Q_{\frac{3M}{2}+1}$

. .
. .
. .

$P_{\frac{M}{2}-1} \quad -Q_M - Q_{2M-1}$ $P_{\frac{M}{2}} \quad Q_0 - Q_{M-1}$ $P_{\frac{M}{2}+1} \quad Q_1 - Q_{M-2}$

. .
. .
. .

$P_{M-1} \quad Q_{\frac{M}{2}-1} - Q_{\frac{M}{2}}$

While demodulator 400 has been shown as a single circuit for generating either the in-phase or quadrature components, it will be apparent to those skilled in the art that two separate polyphase processors and transform circuits may be operated in parallel to generate the I and Q components at the same time. The circuit used to generate the in-phase component does not require the sign change circuit 410.

While the above described embodiments of the present invention have been described in terms of discrete circuit components, it will be apparent to those skilled in the art that the present invention may be implemented on a general purpose computer or other programmed digital computational circuitry.

Various modifications to the present invention will become apparent to those skilled in the art from the foregoing description and accompanying drawings. Accordingly, the present invention is to be limited solely by the scope of the following claims.

What is claimed is:

1. A modulation circuit for generating M time-domain signal values from M symbol values, said modulation circuit comprising:

a transform circuit for generating M transformed symbol values by computing a frequency domain to time domain transform of said M symbol values;

a polyphase filter bank having 2M FIR filters, each filter having g taps, where g is greater than 1, each said filter having an input and an output, said inputs being connected to said transform circuit such that one of said transformed values is input to each said filter, each said transformed symbol value used as input to two of said filters; and a polyphase filter processing circuit for combining said outputs of said filters to generate said M time-domain signal values.

2. The modulation circuit of claim 1 further comprising:

means for changing the sign of every other symbol value prior to said transform circuit generating said M transformed symbol values; and means for re-ordering said transformed symbol values prior to inputting said transformed symbol values to said polyphase filter bank.

3. A demodulation circuit for generating M symbol values from a group of received M time-domain signal values, said demodulation circuit comprising:

means for storing said M time-domain signal values and a previously received group of M signal values;

a polyphase filter bank having 2M FIR filters, each filter having g taps, where g is greater than 1, each said filter having an input and an output, said inputs being connected to said storing means such that one of said received signal values is input to each said filter, each said received signal value being used as input to one of said filters;

a polyphase processor for combining said outputs of said filters to generate M-polyphase values; and a transform circuit for transforming said polyphase values via a time domain to frequency domain transform to generate M symbol values.

4. The demodulation circuit of claim 3 further comprising means for changing the sign of every other one of said M symbol values.

* * * * *

UNITED STATES PATENT AND TRADEMARK OFFICE
CERTIFICATE OF CORRECTION

PATENT NO. : 5,631,610
DATED : 5/20/97
INVENTOR(S) : Sandberg, et al.

It is certified that error appears in the above-identified patent and that said Letters Patent is hereby corrected as shown below:

Column 2, line 22, delete "carder" and insert "carrier"
Column 3, line 26, delete "sub-carder" and insert "sub-carrier"
Column 4, line 35, delete "Acaddmic" and insert "Academic"

Signed and Sealed this

Ninth Day of December, 1997

Attest:

Attesting Officer

BRUCE LEHMAN

Commissioner of Patents and Trademarks